United States Patent
Wang et al.

(10) Patent No.: US 11,442,680 B2
(45) Date of Patent: Sep. 13, 2022

(54) DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Kaiwen Wang, Beijing (CN); Haifeng Xu, Beijing (CN); Hui Dong, Beijing (CN); Guangying Mou, Beijing (CN); Zhenyu Han, Beijing (CN); Xiaojun Wu, Beijing (CN)

(73) Assignees: HEFEI XINSHENG OPTOELECTRONICS TECHNOLOGY CO., LTD., Anhui (CN); Beijing BOE Technology Development Co., Ltd., Beijing (CN)

( * ) Notice: Subject to any disclaimer, the term of this patent is extended or adjusted under 35 U.S.C. 154(b) by 211 days.

(21) Appl. No.: 16/864,517

(22) Filed: May 1, 2020

(65) Prior Publication Data

US 2021/0142715 A1    May 13, 2021

(30) Foreign Application Priority Data

Nov. 7, 2019 (CN) .......................... 201911081553.3

(51) Int. Cl.
*G06F 3/14* (2006.01)
*G09G 3/296* (2013.01)
(Continued)

(52) U.S. Cl.
CPC ................ *G06F 3/14* (2013.01); *G06F 3/147* (2013.01); *G09G 3/296* (2013.01); *H05K 1/0393* (2013.01);
(Continued)

(58) Field of Classification Search
CPC .... G09G 3/296; H05K 1/0393; H05K 5/0017; G06F 3/14; G06F 3/147
See application file for complete search history.

(56) References Cited

U.S. PATENT DOCUMENTS

| | | | |
|---|---|---|---|
| 8,107,235 B2* | 1/2012 | Yeh | H04M 1/0237 361/679.56 |
| 2002/0180923 A1* | 12/2002 | Aoyagi | G02F 1/133615 349/149 |

(Continued)

FOREIGN PATENT DOCUMENTS

| | | |
|---|---|---|
| CN | 101464572 A | 6/2009 |
| CN | 202003942 U | 10/2011 |

(Continued)

OTHER PUBLICATIONS

Office Action dated Apr. 22, 2021 in CN Application No. 201911081553.3, 10 pages.

*Primary Examiner* — Fred Tzeng
(74) *Attorney, Agent, or Firm* — Muncy, Geissler, Olds & Lowe, P.C.

(57) ABSTRACT

A display device is provided, including: a display panel; a backlight module; a circuit board, arranged on a side of the backlight module facing away from the display panel; a flexible circuit board, connected to the circuit board and the display panel, where the flexible circuit board includes a bending portion arranged on a side of the backlight module and extending from the display panel to the circuit board; a circuit board protective frame, arranged around the circuit board and the flexible circuit board, where an opening is provided on a first portion of the circuit board protective frame, and the first portion is a portion of the circuit board protective frame facing the bending portion; and a buffer (Continued)

structure, fixed on the circuit board protective frame, arranged parallel to the circuit board protective frame, and covering the opening.

18 Claims, 4 Drawing Sheets

(51) Int. Cl.
    *H05K 1/03*     (2006.01)
    *H05K 5/00*     (2006.01)
    *G06F 3/147*     (2006.01)

(52) U.S. Cl.
    CPC ....... H05K 5/0017 (2013.01); *H05K 2201/05* (2013.01)

(56) References Cited

U.S. PATENT DOCUMENTS

| | | | |
|---|---|---|---|
| 2003/0011547 A1* | 1/2003 | Igarashi | G09G 3/20 345/87 |
| 2003/0060062 A1* | 3/2003 | Honda | H05K 1/111 439/67 |
| 2004/0188418 A1* | 9/2004 | Aisenbrey | H05B 3/145 219/528 |
| 2005/0118868 A1* | 6/2005 | Nagashima | H05K 9/006 439/76.1 |
| 2009/0168402 A1* | 7/2009 | Liu | G02B 6/0088 362/97.1 |
| 2009/0284681 A1* | 11/2009 | Inoue | G02F 1/13452 349/58 |
| 2013/0016049 A1 | 1/2013 | Eom et al. | |
| 2013/0088664 A1* | 4/2013 | Ohhashi | H05K 1/0274 349/62 |
| 2016/0187558 A1* | 6/2016 | Jung | F21V 21/14 349/65 |
| 2017/0354041 A1* | 12/2017 | Yamaguchi | G02F 1/13 |
| 2019/0129092 A1* | 5/2019 | Zhang | G02B 6/0093 |
| 2019/0129229 A1* | 5/2019 | Cui | G02F 1/13452 |
| 2019/0204660 A1* | 7/2019 | Maemuko | G02F 1/133308 |
| 2019/0206304 A1* | 7/2019 | Fan | H05K 1/189 |
| 2020/0057523 A1* | 2/2020 | Park | G06F 3/044 |
| 2021/0011531 A1* | 1/2021 | Wang | H01L 27/3276 |

FOREIGN PATENT DOCUMENTS

| | | |
|---|---|---|
| CN | 102707476 A | 10/2012 |
| CN | 102881710 A | 1/2013 |
| CN | 103676278 A | 3/2014 |
| CN | 104965331 A | 10/2015 |
| CN | 107728365 A | 2/2018 |
| CN | 207623650 U | 7/2018 |
| CN | 109649836 A | 4/2019 |
| CN | 110082961 A | 8/2019 |

* cited by examiner

DISPLAY DEVICE

CROSS-REFERENCE TO RELATED APPLICATION

This application claims a priority to Chinese Patent Application No. 201911081553.3 filed on Nov. 7, 2019, the disclosure of which is incorporated in its entirety by reference herein.

TECHNICAL FIELD

The present disclosure relates to the field of display technology, and in particular to a display device.

BACKGROUND

With the development of display technology, full-screen display has gradually become the consumption trend of electronic products nowadays. In a full-screen display device, a region where a chip on flex (or chip on film, COF; or may be referred to as a flexible circuit board) connected to a printed circuit board is attached to and connected to an array substrate is affected by force, resulting in quality problems of the full-screen display device.

SUMMARY

Some embodiments of the present disclosure provide a display device, including:
a display panel;
a backlight module;
a circuit board, arranged on a side of the backlight module facing away from the display panel;
a flexible circuit board, connected to the circuit board and the display panel, where the flexible circuit board includes a bending portion, and the bending portion is provided on a side of the backlight module and extends from the display panel to the circuit board;
a circuit board protective frame, arranged around the circuit board and the flexible circuit board, where an opening is provided on a first portion of the circuit board protective frame, and the first portion is a portion of the circuit board protective frame facing the bending portion; and
a buffer structure, fixed on the circuit board protective frame, arranged parallel to the circuit board protective frame, and covering the opening.

In some embodiments, in the display device, the buffer structure is an adhesive tape attached to a surface of the circuit board protective frame facing away from the flexible circuit board.

In some embodiments, in the display device, the buffer structure includes: an elastic support, and a flexible conductive layer on the elastic support.

In some embodiments, in the display device, the elastic support is made of polyethylene terephthalate (PET) material.

In some embodiments, in the display device, the flexible conductive layer includes a flexible cloth material layer connected to the elastic support, and a conductive material layer is provided on a surface of the flexible cloth material layer facing away from the elastic support.

In some embodiments, in the display device, a thickness of the elastic support ranges from 0.8 mm to 2 mm.

In some embodiments, a thickness of the flexible conductive layer ranges from 0.05 mm to 0.08 mm.

In some embodiments, in the display device, the circuit board protective frame is provided with at least two openings separated from each other, and the buffer structure as an integral structure, is fixed on the circuit board protective frame and covers each of the at least two openings.

In some embodiments, in the display device, the buffer structure includes a single-layer region and a double-layer region, an adhesive layer is provided on a surface of the single-layer region and is attached to and connected to a surface of the circuit board protective frame facing away from the flexible circuit board, and the double-layer region is formed by attaching two layers of single-layer regions and covers the opening.

In some embodiments, in the display device, an orthographic projection of the buffer structure and the circuit board protective frame onto a display surface of the display panel is located in a border region of the display panel.

In some embodiments, the display device, the opening is located at an edge of the circuit board protective frame close to the display panel, a portion of the buffer structure extends to a surface where the flexible circuit is connected to the display panel, and the portion covers the opening.

In some embodiments, in the display device, the flexible circuit board includes a first connection region connected to the display panel, a portion where the bending portion is connected to the first connection region is an inclined region, and the inclined region is inclined relative to the display panel and a vertical surface of the display panel.

In some embodiments, in the display device, the display panel includes an array substrate and a color filter substrate, the array substrate is on a light exiting side of the color filter substrate, the array substrate includes a protruding portion protruding relative to the color filter substrate, and the flexible circuit board is fixedly connected to the protruding portion.

In some embodiments, an orthographic projection of the buffer structure and the circuit board protective frame onto a plane where the display panel is located is within an orthographic projection of the protruding portion onto the plane.

BRIEF DESCRIPTION OF THE DRAWINGS

In order to clarify the technical solutions according to the embodiments of the present disclosure, the drawings used in the description of the embodiments are briefly introduced hereinafter. Apparently, the drawings merely illustrate some embodiments of the present disclosure, and other drawings may be obtained based on these drawings by those skilled in the art without any creative efforts.

DETAILED DESCRIPTION

In order that technical problems to be addressed, technical solutions and advantages of the present disclosure can be clearer, descriptions are provided in detail hereinafter in conjunction with drawings and embodiments.

In the related technologies, in a full-screen display device, a chip on flex (or chip on film, COF; also may be called a flexible circuit board) connected to a printed circuit board is folded back and bypasses edges of a display panel and a backlight structure, and is connected to the array substrate. In order to achieve full-screen display effect, the array substrate is usually arranged on the color film substrate, and an area of the array substrate is larger than an area of the color film substrate, which is for shielding the backlight structure and the flexible circuit board inside the display module.

The flexible circuit board has the problem of warpage after it is folded back at the edge of the backlight structure. Due to the narrow frame of the module of the full-screen display device, the separation distance between the flexible circuit board and the printed circuit board (PCB) outer frame is small. The folded and warped flexible circuit board may contact the PCB outer frame, which causes the flexible circuit board to easily squeeze with the PCB outer frame during product assembly and transportation, and a region where the flexible circuit board is attached and connected to the array substrate to be subjected to pulling force, resulting in a problem of peel-off.

In order to solve the problem of peel-off in the related technologies, which is caused due to the fact that the flexible circuit board easily squeezes with the PCB outer frame and then a region where the flexible circuit board is attached and connected to the array substrate is subjected to pulling force, some embodiments of the present disclosure provide a display device. An opening is provided in a portion of a circuit board protective frame of the display device facing a flexible circuit board, and the opening is covered with a buffer structure, to provide a buffering force for supporting the flexible circuit board, in this way, the problem of peel-off, which is caused due to the fact that squeeze with the flexible circuit board occurs and then the attachment and connection between the flexible circuit board and the array substrate are subjected to pulling force, is avoided.

Figure 1:
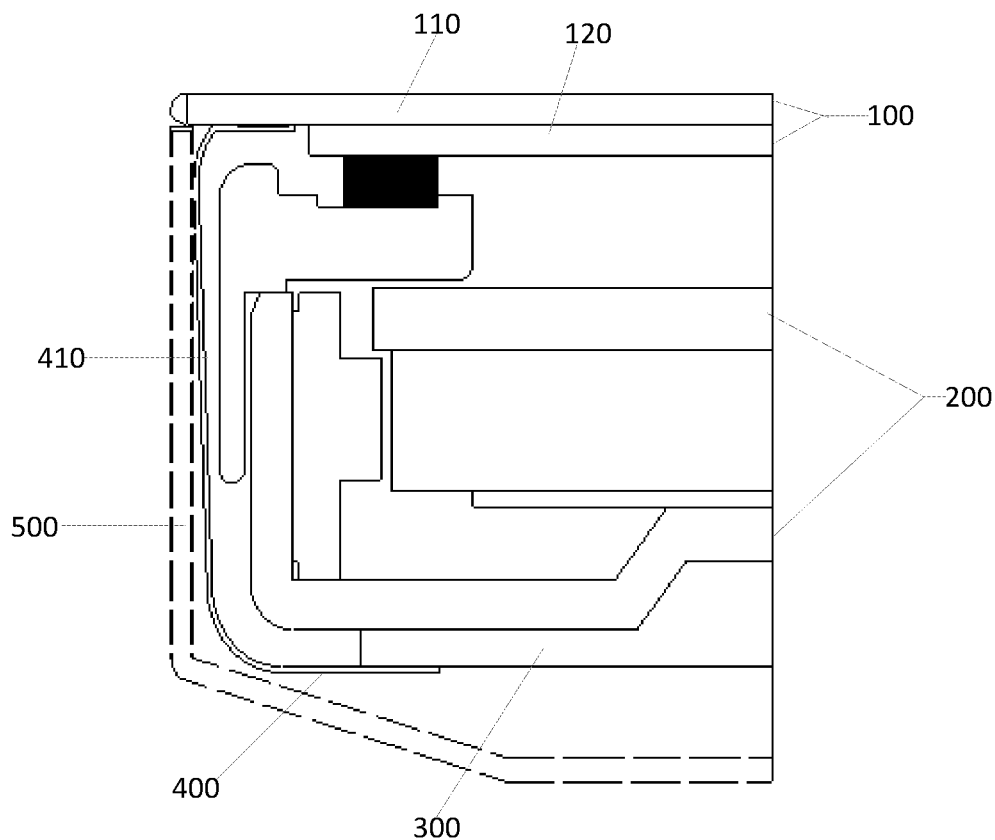
FIG. 1 is a schematic structural diagram for explaining a positional relationship of a flexible circuit board relative to a circuit board protective frame in a display device.

FIG. 1 is a schematic structural diagram for explaining a positional relationship of a flexible circuit board relative to a circuit board protective frame in a display device.

In some embodiments of the present disclosure, the display device includes a display panel 100, a backlight module 200, a circuit board 300, and a flexible circuit board 400. The circuit board 300 is arranged on a side of the backlight module 200 facing away from the display panel 100. The flexible circuit board 400 is connected to the circuit board 300 and the display panel 100, and includes a bending portion 410. The bending portion 410 is on a side of the backlight module 200, and extends from the display panel 100 to the circuit board 300.

Further, referring to FIG. 1, the circuit board protective frame 500 is generally provided on an outer side of the circuit board 300, and is formed as a structure around the circuit board 300 and the flexible circuit board 400.

In the embodiments of the present disclosure, the circuit board protective frame 500 being around the circuit board 300 and the flexible circuit board 400 may for example refer to that the circuit board protective frame 500 is arranged along the circuit board 300 and the flexible circuit board 400, and covers the circuit board 300 and the flexible circuit board 400 from the lateral side and the lower side.

In some embodiments of the present disclosure, in order to meet the narrow bezel design requirements of the display device, the flexible circuit board 400 is connected to the array substrate 110 of the display panel 100, and the array substrate 110 is arranged on a light exiting side of the color filter substrate 120. The array substrate 110 includes a protruding portion protruding relative to the color filter substrate 120. The flexible circuit board 400 is fixed to the protruding portion of the array substrate 110 and is arranged on a surface of the protruding portion facing the color filter substrate 120.

Figure 2:
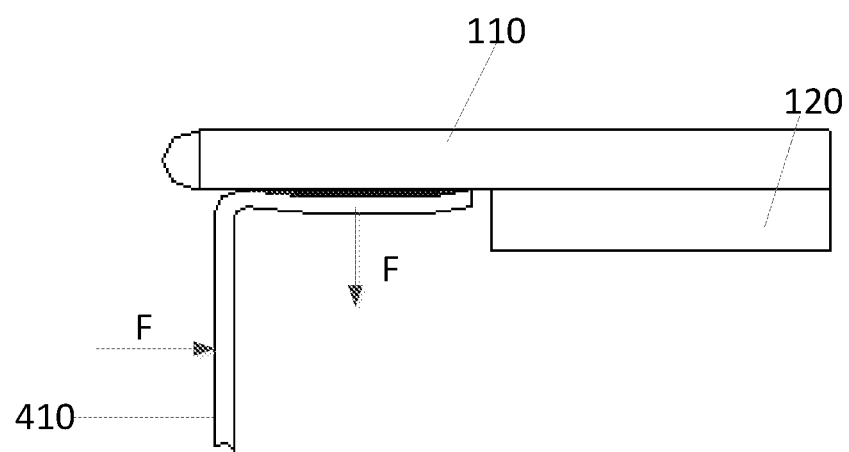
FIG. 2 is a schematic structural diagram for explaining a state in which a flexible circuit board is subjected to tensile stress in a display device.

Based on the structure of the above display device, in order to satisfy electromagnetic interference shielding effect of the display device, the circuit board protective frame 500 is usually made of a metal material. In addition, due to the small thickness of the flexible circuit board 400, the separation distance between the flexible circuit board 400 and the circuit board protective frame 500 is small, and the flexible circuit board 400 is easily folded back and warped to be in hard contact with the circuit board protective frame 500, which causes the flexible circuit board 400 to withstand a hard pressure from the circuit board protective frame 500. As shown in FIG. 2, the bonding connection region between the flexible circuit board 400 and the array substrate 110 withstands a tensile stress toward the inside of the display device, resulting in the problem of peel-off.

Figure 3:
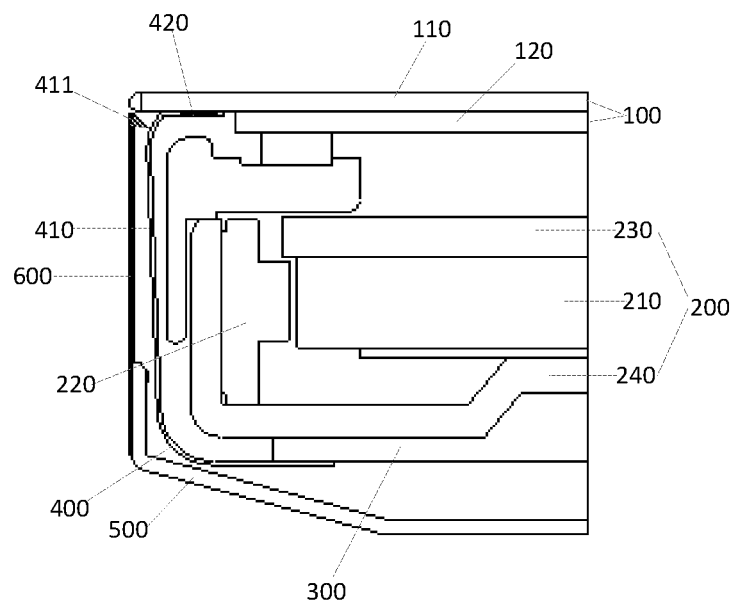
FIG. 3 is a schematic cross-sectional structural diagram of a display device according to some embodiments of the present disclosure.
Figure 4:
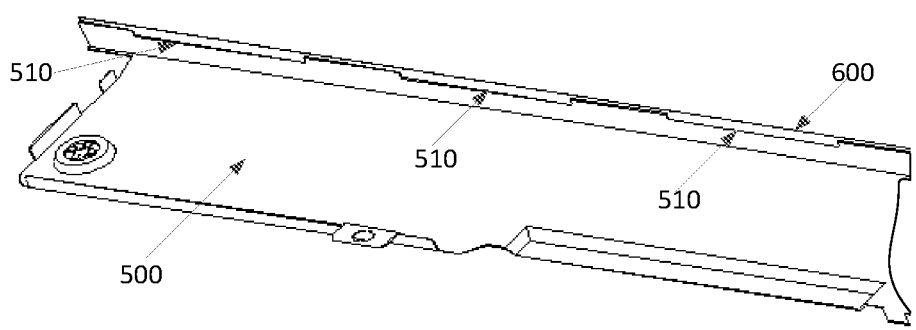
FIG. 4 is a schematic stereogram of an implementation of a circuit board protective frame in some embodiments of the present disclosure.

Based on the above, in some embodiments of the present disclosure, as shown in FIG. 3 and FIG. 4, in the display device, an opening 510 is provided on a first portion of the circuit board protective frame 500 facing the bending portion 410 of the flexible circuit board 400, and the display device further includes:

a buffer structure 600, which is fixed on the circuit board protective frame 500 and arranged parallel to the circuit board protective frame 500 and covers the opening 510.

In the embodiments of the present disclosure, the first portion of the circuit board protective frame 500 facing the bending portion 410 of the flexible circuit board 400 may for example refer to a portion of the circuit board protective frame 500 that is close to the bending portion 410. Specifically, the portion may correspond to a position where the flexible circuit board is easily in contact with the protective frame in the related technologies.

As shown in FIG. 3, based on the implementation structure, when the display device described in the embodiments of the present disclosure is adopted, the protective frame, which is arranged around the circuit board 300 and the flexible circuit board 400 and is used to shield and block the circuit board 300 and the flexible circuit board 400, is formed by two parts. A buffer structure 600 is formed at the part of the protective frame opposite to the flexible circuit board 400, which is used to provide a buffering force in contacting the flexible circuit board 400, so as to avoid a hard squeezing force with the flexible circuit board, as compared to the related technologies.

In some embodiments, the buffer structure 600 is formed as an adhesive tape and is attached to a surface of the circuit board protective frame 500 facing away from the flexible circuit board 400.

Specifically, by setting the buffer structure 600 in the form of the adhesive tape, the installation of the buffer structure 600 on the circuit board protective frame 500 is simpler and more convenient; by attaching the buffer structure 600 to the surface of the circuit board protective frame 500 away from the flexible circuit board 400, the separation distance from the flexible circuit board 400 is increased, and the probability of contact with the flexible circuit board 400 is reduced.

Figure 5:
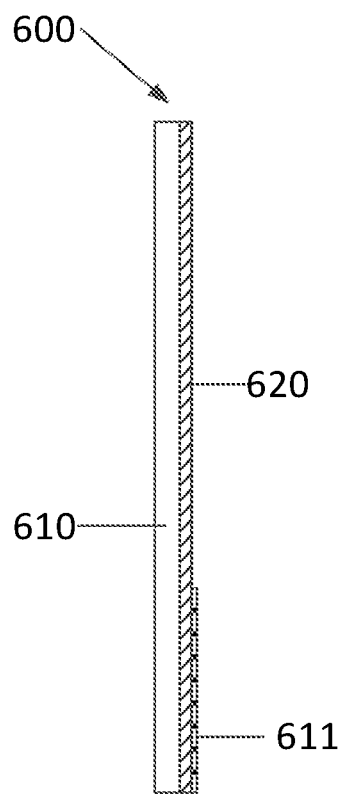
FIG. 5 is a schematic cross-sectional structural diagram of an implementation of a buffer structure in some embodiments of the present disclosure.

In some embodiments of the present disclosure, as shown in FIG. 5, the buffer structure 600 includes:

an elastic support 610 and a flexible conductive layer 620 provided on the elastic support 610.

Specifically, a side of the buffer structure 600 where the flexible conductive layer 620 is provided is arranged toward the flexible circuit board 400.

In addition, the elastic support 610 included in the buffer structure 600 has certain stiffness to effectively shield the flexible circuit board 400 and to support the flexible conductive layer 620. The flexible conductive layer 620 included in the buffer structure 600 has flexible characteristic and can play a buffering role when it contacts the flexible circuit board 400.

Further, in some embodiments of the present disclosure, in order to achieve the electromagnetic interference shielding effect on the circuit board 300 and the flexible circuit board 400, the circuit board protective frame 500 is made of a metal material. In addition, since the flexible conductive layer 620 is provided on the buffer structure 600 and is provided toward the display panel 100 and the flexible circuit board 400, it may also serve as a medium for electrostatic transmission. Therefore, the combination of the buffer structure 600 provided with the flexible conductive layer 620 and the circuit board protective frame 500 can effectively shield the electromagnetic interference generated inside the display device.

In some embodiments of the present disclosure, according to the above, the buffer structure 600 may be formed as the adhesive tape. In some embodiments, the buffer structure 600 including the elastic support 610 and the flexible conductive layer 620 is formed as a composite adhesive tape. An adhesive layer 611 is provided on at least a part of a surface of the flexible conductive layer 620, as shown in FIG. 5, the buffer structure 600 may be attached and fixed on the circuit board protective frame 500 in an adhesion manner, and the buffer structure 600 may be attached to a surface of the circuit board protective frame 500 facing away from the flexible circuit board 400 as shown in FIG. 3.

In some embodiments, the elastic support 610 is made of polyethylene terephthalate (PET) material, which has certain stiffness, and can effectively shield the flexible circuit board 400 and play a supporting role for the flexible conductive layer 620, preventing the buffer structure 600 formed as the adhesive tape from wrinkling. It should be noted that the elastic support 610 is not limited to only being made of PET material, as long as the elastic support 610 can be made to have certain stiffness and satisfy the shielding effect on the flexible circuit board 400.

In some embodiments, as shown in FIG. 5, the flexible conductive layer 620 includes a flexible cloth material layer connected to the elastic support 610, and a surface of the flexible cloth material layer facing away from the elastic support 610 is provided with a conductive material layer, to realize the electrostatic transmission function of the flexible conductive layer.

In addition, the flexible cloth material layer provided with the conductive material layer can not only satisfy the conductive effect, but also have characteristics of smooth and suppleness, avoiding the problem of poor brightness of total reflection of the outer surface.

In some embodiments, a thickness of the elastic support 610 is between 0.8 millimeters (mm) and 2 mm (inclusively), and a thickness of the flexible conductive layer 620 is between 0.05 mm and 0.08 mm (inclusively). In some embodiments, the thickness of the elastic support 610 is between 0.8 mm and 1 mm (inclusively). It should be noted that in a specific implementation, the thickness of the elastic support 610 may be determined according to the separation distance between the circuit board protective frame 500 and the flexible circuit board 400.

In some embodiments of the present disclosure, as shown in FIG. 4, the circuit board protective frame 500 is provided with an opening 510 at a position facing the flexible circuit board 400 to make space for the flexible circuit board 400 and increase the separation distance from the flexible circuit board 400. No opening 510 is provided at a position that is not facing the flexible circuit board 400 to ensure the overall strength of the circuit board protective frame 500.

In some embodiments, as shown in FIGS. 3 and 4, an edge of the circuit board protective frame 500 near the display panel 100 is provided with openings 510, and the quantity of the openings 510 may be at least two, which are separated from each other and are arranged in sequence along an edge of the circuit board protective frame 500. The buffer structure 600, as an integral structure, is attached to the circuit board protective frame 500, and covers each opening 510.

In addition, since the bending portion 410 of the flexible circuit board 400 extends to be connected with the display panel 100, in order to ensure the effective shielding protection of the flexible circuit board 400 by the buffer structure 600, a portion of the buffer structure 600 that covers the opening 510 extends to a surface where the flexible circuit board 400 is connected to the display panel 100, so that the buffer structure 600 can cover the outside of the flexible circuit board 400 as a whole.

In some embodiments of the present disclosure, as shown in FIG. 3, since the array substrate 110 is arranged on the light exiting side of the color filter substrate 120, the flexible circuit board 400 is fixed to a protruding portion of the array substrate 110 which protrudes relative to the color filter substrate 120, the buffer structure 600 covers the portion of the opening 510 and extends to a surface of the protruding portion of the array substrate 110 that faces the color filter substrate 120.

Figure 6:
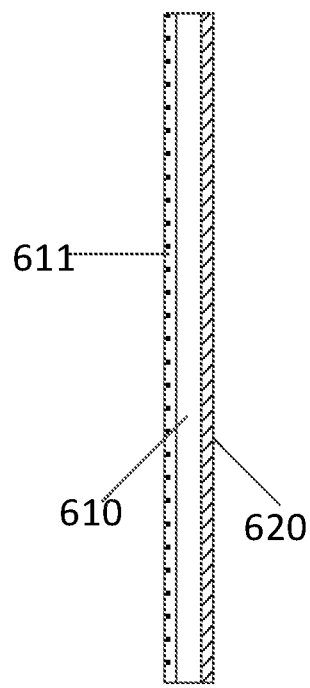
FIG. 6 is a schematic cross-sectional structural diagram of an implementation of an adhesive structure for fabricating a buffer structure in some embodiments of the present disclosure.

In the display device described in the embodiments of the present disclosure, in some implementations, as shown in FIG. 6, the adhesive tape forming the buffer structure 600 includes an elastic support 610 and a flexible conductive layer 620 on the basis that the buffer structure 600 is formed as the adhesive tape, and an entire surface of the elastic support 610 facing away from the flexible conductive layer 620 is provided with an adhesive layer 611.

Figure 7:
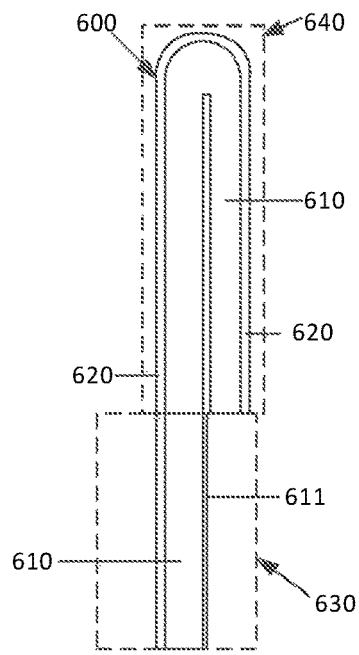
FIG. 7 is a schematic cross-sectional structural diagram of another implementation of a buffer structure in some embodiment of the present disclosure.

The adhesive structure formed by this structure can form the buffer structure attached to the circuit board protective frame 500 in the embodiments of the present disclosure. Specifically, as shown in FIG. 7, the formed buffer structure 600 includes a single-layer region 630 and a double-layer region 640. The single-layer region 630 is also a single layer of adhesive tape, a surface thereof is an adhesive layer 611, and an opposite surface thereof is a flexible conductive layer 620. The double-layer region 640 is formed by attaching two single-layer regions 630 (that is, two layers of adhesive tapes). In some embodiments, the double-layer region 640 of the buffer structure 600 may be formed by bending a single-layer adhesive tape and then attaching the single-layer adhesive tape face to face.

Figure 8:
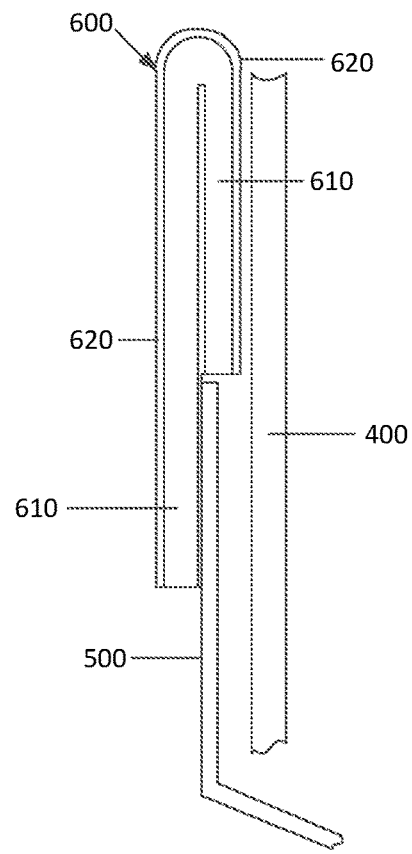
FIG. 8 is a schematic diagram for explaining a structural relationship between a buffer structure in the implementation shown in FIG. 7, a flexible circuit board, and a circuit board protective frame.

With the buffer structure 600 of the above structure, as shown in FIG. 8, the adhesive layer 611 of the single-layer region 630 of the buffer structure 600 is attached to the surface of the circuit board protective frame 500 facing away from the flexible circuit board 400. The size of the double-layer region 640 is set according to the size of the opening 510, and the double-layer region 640 can cover the opening 510.

In addition, in some embodiments, as shown in FIG. 7, the single-layer region 630 of the buffer structure 600 includes an elastic support 610 and a flexible conductive layer 620 arranged on the elastic support 610, and the adhesive layer 611 is located on a surface of the elastic support 610 facing away from the flexible conductive layer 620; since the double-layer region 640 of the buffer structure 600 is formed by attaching two single-layer regions 630, the double-layer region 640 includes two layers of elastic supports 610 in the middle and a flexible conductive layer 620 on the outer surface of two layers of elastic supports 610 as compared to the single-layer region 630, so that the thickness of the elastic supports 610 of the double-layer region 640 is twice the thickness of the elastic support 610 of the single-layer region 630.

Based on the above-mentioned implementation structure, the buffer structure 600 formed as the adhesive tape may be fixed on the circuit board protective frame 500 by adhesion. To realize that the surface of the buffer structure 600 facing the flexible circuit board 400 is provided as the flexible conductive layer 620, after the single-layer region 630 formed as an adhesive tape is attached to the circuit board protective frame 500, the single-layer region 630 at the portion corresponding to the opening 510 are folded to form the double-layer region 640. In the buffer structure 600 having the above-mentioned structure, the surface of the buffer structure 600 facing the flexible circuit board 400 is the flexible conductive layer 620.

In the display device described in the embodiments of the present disclosure, in some implementations, as shown in FIG. 3, the flexible circuit board 400 includes a first connection region 420 connected to the display panel 100, a portion where the bending portion 410 is connected to the first connection region 420 is formed as an inclined region 411, and the inclined region 411 is inclined with respect to the display panel 100 and a vertical surface of the display panel 100. Based on this arrangement structure, the inclined region 411 is formed into a form of a chamfered structure with, for example, a length and a width each ranging from 0.15 to 0.2 mm, as compared to the first connection region 420. As a result, at a position where the flexible circuit board 400 is connected to the display panel 100, there is a larger avoidance space, for avoiding contact with the buffer structure 600 and reducing the tensile stress on the first connection region 420.

In some embodiments of the present disclosure, the display device is formed as a full-screen display device, the flexible circuit board 400 and the circuit board protective frame 500 are both arranged on a side of the display panel 100 close to the backlight module 200, and an orthographic projection of the buffer structure 600 and the circuit board protective frame 500 onto a display surface of the display panel 100 is located in a border region of the display panel 100. In some embodiments, an orthographic projection of the buffer structure 600 and the circuit board protective frame 500 onto a plane where the display panel 100 is located is within an orthographic projection of the protruding portion the array substrate 110 relative to the color filter substrate 120 onto the plane. That is, when the array substrate 110 is arranged above the color filter substrate 120, the protruding portion is located directly above the buffer structure 600 and the circuit board protective frame 500 to shield the buffer structure 600 and the circuit board protective frame 500 so as to form a full-screen display effect.

In the embodiments of the present disclosure, the orthographic projection A being located in the region B (or the orthographic projection C) may refer to that the area of the orthographic projection A is less than or equal to the area of the region B (or orthographic projection C), and the orthographic projection A does not exceed the range of the region B (or orthographic projection C).

It should be noted that in some embodiments of the present disclosure, as shown in FIG. 3, the backlight module 200 includes a light guide plate 210, a side light source 220, an optical film 230, a bottom plate 240, etc., and those skilled in the art can understand that, in the display device described in the embodiments the present disclosure, the connection manner between components of the backlight module 200 and the fixing manner between the backlight module 200 and the display panel 100 are not described in detail herein.

With the display device described in the embodiments of the present disclosure, the opening is provided in the portion of the display device where the circuit board protective frame and the flexible circuit board are opposite, and the opening is covered with the buffer structure. In this way, the problem of peel-off in the related technologies, which is caused due to the fact that the flexible circuit board easily squeezes with the PCB outer frame and then a region where the flexible circuit board is attached and connected to the array substrate is subjected to pulling force, can be solved.

In some embodiments of the present disclosure, the display device may be, for example, a mobile phone, a tablet computer, a television, a notebook computer, a digital photo frame, a navigator, or any other product or component with a display function.

Unless otherwise defined, the technical or scientific terms used in the present disclosure shall have the common meanings understood by those of ordinary skill in the art to which the present disclosure belongs. The terms "first", "second", and the like used in the present disclosure do not indicate any order, quantity, or importance, but are only used to distinguish different components. Word such as "including" or "comprising" means that the element or item listed before the word covers the element or item listed after the word and the equivalent thereof without excluding other elements or items. Word such as "connected" or "coupled" are not limited to physical or mechanical connection, but may include electrical connection, whether direct or indirect. "Up", "down", "left", "right", etc., are only used to indicate the relative position relationship. When the absolute position of the described object changes, the relative position relationship may change accordingly.

It can be understood that, when an element such as a layer, a film, a region, or a substrate is referred to as being "on" or "under" another element, it may be directly on or under the another element, or, there may be an intermediate element.

The above descriptions illustrate some implementations of the present disclosure. It should be noted that various improvements and polishments may be made by those skilled in the art without departing from the principle of the present disclosure, and these improvements and polishments shall also fall within the protection scope of the present disclosure.

What is claimed is:

1. A display device, comprising:
   a display panel;
   a backlight module;
   a circuit board, arranged on a side of the backlight module facing away from the display panel;
   a flexible circuit board, connected to the circuit board and the display panel, wherein the flexible circuit board comprises a bending portion, and the bending portion is provided on a side of the backlight module and extends from the display panel to the circuit board;
   a circuit board protective frame, arranged around the circuit board and the flexible circuit board, wherein an opening is provided on a first portion of the circuit board protective frame, and the first portion is a portion of the circuit board protective frame facing the bending portion; and
   a buffer structure, fixed on the circuit board protective frame, arranged parallel to the circuit board protective frame, and covering the opening,
   wherein the buffer structure comprises a single-layer region and a double-layer region, an adhesive layer is provided on a surface of the single-layer region and is attached to and connected to a surface of the circuit board protective frame facing away from the flexible circuit board, and the double-layer region is formed by attaching two layers of single-layer regions and covers the opening.

2. The display device according to claim 1, wherein the buffer structure is an adhesive tape attached to a surface of the circuit board protective frame facing away from the flexible circuit board.

3. The display device according to claim 1, wherein the buffer structure comprises: an elastic support, and a flexible conductive layer on the elastic support.

4. The display device according to claim 3, wherein the elastic support is made of polyethylene terephthalate (PET) material.

5. The display device according to claim 3, wherein the flexible conductive layer comprises a flexible cloth material layer connected to the elastic support, and a conductive material layer is provided on a surface of the flexible cloth material layer facing away from the elastic support.

6. The display device according to claim 3, wherein a thickness of the elastic support ranges from 0.8 mm to 2 mm.

7. The display device according to claim 3, wherein a thickness of the flexible conductive layer ranges from 0.05 mm to 0.08 mm.

8. The display device according to claim 1, wherein the circuit board protective frame is provided with at least two openings separated from each other, and the buffer structure as an integral structure, is fixed on the circuit board protective frame and covers each of the at least two openings.

9. The display device according to claim 1, wherein an orthographic projection of the buffer structure and the circuit board protective frame onto a display surface of the display panel is located in a border region of the display panel.

10. The display device according to claim 9, wherein the opening is located at an edge of the circuit board protective frame close to the display panel, a portion of the buffer structure extends to a surface where the flexible circuit is connected to the display panel, and the portion covers the opening.

11. The display device according to claim 1, wherein the opening is located at an edge of the circuit board protective frame close to the display panel, a portion of the buffer structure extends to a surface where the flexible circuit is connected to the display panel, and the portion covers the opening.

12. The display device according to claim 1, wherein the flexible circuit board comprises a first connection region connected to the display panel, a portion where the bending portion is connected to the first connection region is an inclined region, and the inclined region is inclined relative to the display panel and a vertical surface of the display panel.

13. The display device according to claim 12, wherein the buffer structure is an adhesive tape attached to a surface of the circuit board protective frame facing away from the flexible circuit board.

14. The display device according to claim 12, wherein the buffer structure comprises: an elastic support, and a flexible conductive layer on the elastic support.

15. The display device according to claim 14, wherein the flexible conductive layer comprises a flexible cloth material layer connected to the elastic support, and a conductive material layer is provided on a surface of the flexible cloth material layer facing away from the elastic support.

16. The display device according to claim 12, wherein an orthographic projection of the buffer structure and the circuit board protective frame onto a display surface of the display panel is located in a border region of the display panel.

17. The display device according to claim 1, wherein the display panel comprises an array substrate and a color filter substrate, the array substrate is on a light exiting side of the color filter substrate, the array substrate comprises a protruding portion protruding relative to the color filter substrate, and the flexible circuit board is fixedly connected to the protruding portion.

18. The display device according to claim 17, wherein an orthographic projection of the buffer structure and the circuit board protective frame onto a plane where the display panel is located is within an orthographic projection of the protruding portion onto the plane.

* * * * *